United States Patent
Queens et al.

(10) Patent No.: US 6,906,785 B2
(45) Date of Patent: Jun. 14, 2005

(54) LITHOGRAPHIC APPARATUS, DEVICE MANUFACTURING METHOD, AND DEVICE MANUFACTURED THEREBY

(75) Inventors: Rene Marinus Gerardus Johan Queens, Eindhoven (NL); Paulus Antonius Andreas Teunissen, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 105 days.

(21) Appl. No.: 10/419,979

(22) Filed: Apr. 22, 2003

(65) Prior Publication Data

US 2003/0218141 A1 Nov. 27, 2003

(30) Foreign Application Priority Data

Apr. 23, 2002 (EP) ............................................. 02252852

(51) Int. Cl.[7] ......................... G03B 27/42; G03B 27/52; G03B 27/32; G01N 21/86
(52) U.S. Cl. ............................ 355/53; 355/55; 355/77; 250/548
(58) Field of Search ................................ 356/500, 399, 356/400, 401; 355/53, 67, 77; 250/548

(56) References Cited

U.S. PATENT DOCUMENTS

| | | | |
|---|---|---|---|
| 5,191,200 A | * | 3/1993 | van der Werf et al. .. 250/201.4 |
| 5,204,535 A | | 4/1993 | Mizutani |
| 5,461,237 A | | 10/1995 | Wakamoto et al. |
| 5,657,130 A | * | 8/1997 | Shirasu et al. ............... 356/401 |
| 5,838,595 A | | 11/1998 | Sullivan et al. |
| 5,960,107 A | | 9/1999 | Leroux |

OTHER PUBLICATIONS

Australian Patent Office Search Report for Application No. SG 200302267–0, dated Nov. 19, 2004.

* cited by examiner

Primary Examiner—Alan Mathews
(74) Attorney, Agent, or Firm—Pillsbury Winthrop Shaw Pittman LLP

(57) ABSTRACT

A method of calibrating level sensors of at least two lithographic projection apparatus to correct machine to machine level sensor process dependency includes measuring a first set of leveling data using a first lithographic projection apparatus for a reference substrate, measuring a second set of leveling data using the first apparatus for a substrate processed according to a selected process, measuring a third set of leveling data using the second apparatus for the reference substrate, measuring a fourth set of leveling data using the second apparatus for the processed substrate, and using the first, second, third and fourth sets of leveling data to calculate the set of level sensor parameters corresponding to machine to machine level sensor differences for the selected process.

11 Claims, 3 Drawing Sheets

LITHOGRAPHIC APPARATUS, DEVICE MANUFACTURING METHOD, AND DEVICE MANUFACTURED THEREBY

BACKGROUND OF THE INVENTION

1. Field of the Invention

The present invention relates generally to a lithographic projection apparatus and more particularly to apparatus and methods of matching performance from machine to machine.

2. Description of the Related Art

The term "patterning means" as here employed should be broadly interpreted as referring to means that can be used to endow an incoming radiation beam with a patterned cross-section, corresponding to a pattern that is to be created in a target portion of the substrate; the term "light valve" can also be used in this context. Generally, the said pattern will correspond to a particular functional layer in a device being created in the target portion, such as an integrated circuit or other device (see below). Examples of such patterning means include:

A mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired.

A programmable mirror array. One example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the said undiffracted light can be filtered out of the reflected beam, leaving only the diffracted light behind; in this manner, the beam becomes patterned according to the addressing pattern of the matrix-adressable surface. An alternative embodiment of a programmable mirror array employs a matrix arrangement of tiny mirrors, each of which can be individually tilted about an axis by applying a suitable localized electric field, or by employing piezoelectric actuation means. Once again, the mirrors are matrix-addressable, such that addressed mirrors will reflect an incoming radiation beam in a different direction to unaddressed mirrors; in this manner, the reflected beam is patterned according to the addressing pattern of the matrix-adressable mirrors. The required matrix addressing can be performed using suitable electronic means. In both of the situations described hereabove, the patterning means can comprise one or more programmable mirror arrays. More information on mirror arrays as here referred to can be gleaned, for example, from United States Patents U.S. Pat. No. 5,296,891 and U.S. Pat. No. 5,523,193, and PCT patent applications WO 98/38597 and WO 98/33096, which are incorporated herein by reference. In the case of a programmable mirror array, the said support structure may be embodied as a frame or table, for example, which may be fixed or movable as required.

A programmable LCD array. An example of such a construction is given in U.S. Pat. No. 5,229,872, which is incorporated herein by reference. As above, the support structure in this case may be embodied as a frame or table, for example, which may be fixed or movable as required.

For purposes of simplicity, the rest of this text may, at certain locations, specifically direct itself to examples involving a mask and mask table; however, the general principles discussed in such instances should be seen in the broader context of the patterning means as hereabove set forth.

Lithographic projection apparatus can be used, for example, in the manufacture of integrated circuits (ICs). In such a case, the patterning means may generate a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion in one go; such an apparatus is commonly referred to as a wafer stepper. In an alternative apparatus—commonly referred to as a step-and-scan apparatus—each target portion is irradiated by progressively scanning the mask pattern under the projection beam in a given reference direction (the "scanning" direction) while synchronously scanning the substrate table parallel or anti-parallel to this direction; since, in general, the projection system will have a magnification factor M (generally<1), the speed V at which the substrate table is scanned will be a factor M times that at which the mask table is scanned. More information with regard to lithographic devices as here described can be gleaned, for example, from U.S. Pat. No. 6,046,792, incorporated herein by reference.

In a manufacturing process using a lithographic projection apparatus, a pattern (e.g. in a mask) is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4, incorporated herein by reference.

For the sake of simplicity, the projection system may hereinafter be referred to as the "lens"; however, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Dual stage lithographic apparatus are described, for example, in U.S. Pat. No. 5,969,441 and WO 98/40791, incorporated herein by reference.

For the correct positioning of substrate tables in the focus plane of the projection lens, a level sensor is used. Level sensors used in lithographic projection apparatus are subject to at least two types of process dependency. Process dependency is a type of error in which level sensor measurements provide differing results depending on how the substrate being measured has been processed. For example, a substrate having a resist coating may appear to the level sensor to be tilted when it is, in fact, perfectly flat (i.e., has no tilt). Likewise, even in the case that the surface of the resist is at exactly the same height as a surface of a bare substrate, the level sensor may measure the two substrates to have different heights. The first type of error is known as tilt process dependency and the second type of error is known as height process dependency.

Moreover, even apparently identical wafer processing machines may exhibit different tilt process dependency and/or height process dependency for a given process. That is, for a particular substrate that has been processed according to a particular process, the measured height and/or tilt process dependency may vary from machine to machine. This is likewise true for machines of different types. In a fabrication facility, it is common to have many machines working on executing a particular process. An available method of measuring and correcting such machine to machine dependencies is to perform a FEM (focus energy matrix) for every machine for each process. FEMs (and their readout on external devices) are time consuming and performing one for each machine for each process results in undesirable amounts of machine downtime. Thus, it would be helpful to characterize differences in process dependencies from machine to machine without having to measure a complete focus energy matrix for every machine for every process.

SUMMARY OF THE INVENTION

It is an object of the present invention to provide a method of calibrating level sensors of at least two lithographic projection apparatus to correct machine to machine level sensor process dependency differences without performing a FEM for each machine for each process.

This and other objects are achieved according to the invention in a lithographic apparatus as specified in the opening paragraph, characterized in that the apparatus comprises means for measuring a first set of leveling data using a first lithographic projection apparatus for a reference substrate, means for measuring a second set of leveling data using the first apparatus for a substrate processed according to a selected process;

means for measuring a third set of leveling data using the second apparatus for the reference substrate;

means for measuring a fourth set of leveling data using the second apparatus for the substrate processed according to the selected process; and means for using the first, second, third and fourth sets of leveling data to calculate a set of level sensor parameters corresponding to machine to machine level sensor differences for the selected process.

According to a further aspect of the invention there is provided a device manufacturing method comprising the steps of:

providing a substrate that is at least partially covered by a layer of radiation-sensitive material;

providing a projection beam of radiation using a radiation system;

using patterning means to endow the projection beam with a pattern in its cross-section;

projecting the patterned beam of radiation onto a target portion of the layer of radiation-sensitive material, characterized by prior to said imaging, providing a set of process dependent parameters for adjusting the imaging, said parameters being determined by:

measuring a first set of leveling data using a first lithographic projection apparatus for a reference substrate, measuring a second set of leveling data using the first apparatus for a substrate processed according to a selected process;

measuring a third set of leveling data using the second apparatus for the reference substrate;

measuring a fourth set of leveling data using the second apparatus for the substrate processed according to the selected process; and using the first, second, third and fourth sets of leveling data to calculate the set of level sensor parameters corresponding to machine to machine level sensor differences for the selected process.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5–20 nm), as well as particle beams, such as ion beams or electron beams.

BRIEF DESCRIPTION OF THE DRAWINGS

Embodiments of the invention will now be described, by way of example only, with reference to the accompanying schematic drawings in which.

In the Figures, corresponding reference symbols indicate corresponding parts.

DETAILED DESCRIPTION
Embodiments of the Invention

Figure 1:
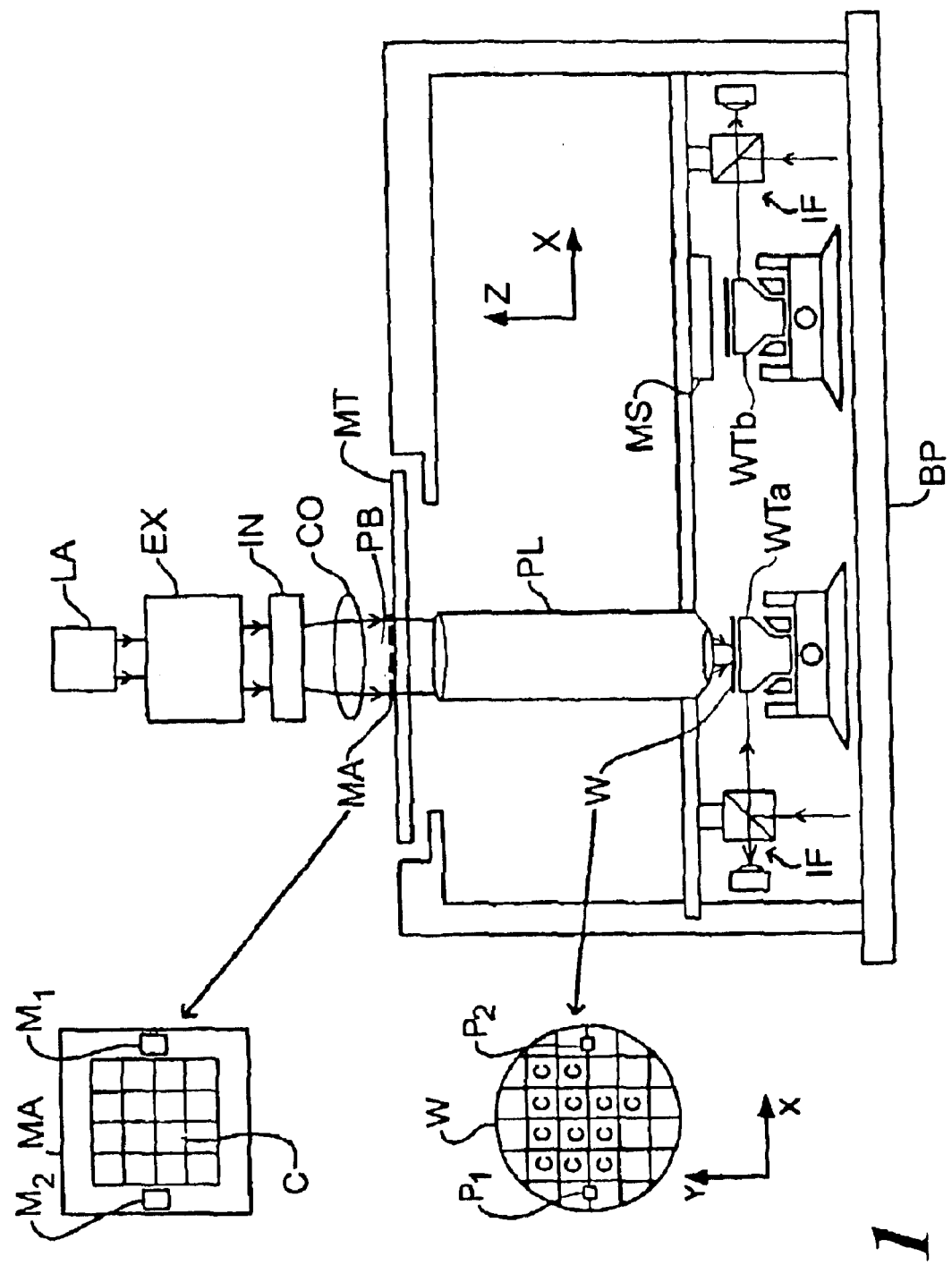
FIG. 1 depicts a lithographic projection apparatus according to an embodiment of the invention.

FIG. 1 schematically depicts a lithographic projection apparatus 1 according to a particular embodiment of the invention. The apparatus comprises:

a radiation system Ex, IL, for supplying a projection beam PB of radiation (e.g. EUV, DUV, electron beam or x-ray radiation). In this particular case, the radiation system also comprises a radiation source LA;

a first object table (mask table) MT provided with a mask holder for holding a mask MA (e.g. a reticle), and connected to first positioning means for accurately positioning the mask with respect to item PL;

a second object table (substrate table) WTa, WTb provided with a substrate holder for holding a substrate W (e.g. a resist-coated silicon wafer), and connected to second positioning means for accurately positioning the substrate with respect to item PL;

a projection system ("lens") PL (e.g. catadioptric, refractive, reflective and/or diffractive elements) for imaging an irradiated portion of the mask MA onto a target portion C (e.g. comprising one or more dies) of the substrate W.

As here depicted, the apparatus is of a transmissive type (i.e. has a transmissive mask). However, in general, it may also be of a reflective type, for example (with a reflective mask). Alternatively, the apparatus may employ another kind of patterning means, such as a programmable mirror array of a type as referred to above.

The source LA (e.g. a laser, lamp, x-ray, ion or electron source) produces a beam of radiation. This beam is fed into an illumination system (illuminator) IL, either directly or after having traversed conditioning means, such as a beam expander Ex, for example. The illuminator IL may comprise adjusting means AM for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 1 that the source LA may be within the housing of the lithographic projection apparatus (as is often the case when the source LA is a mercury lamp, for example), but that it may also be remote from the lithographic projection apparatus, the radiation beam which it produces being led into the apparatus (e.g. with the aid of suitable directing mirrors); this latter scenario is often the case when the source LA is an excimer laser. The current invention and claims encompass both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of the second positioning means (and interferometric measuring means IF), the substrate table WTa, WTb can be moved accurately, e.g. so as to position different target portions C in the path of the beam PB. Similarly, the first positioning means can be used to accurately position the mask MA with respect to the path of the beam PB, e.g. after mechanical retrieval of the mask MA from a mask library, or during a scan. In general, movement of the object tables MT, WTa and WTb will be realized with the aid of a long-stroke module (coarse positioning) and a short-stroke module (fine positioning), which are not explicitly depicted in FIG. 1. However, in the case of a wafer stepper (as opposed to a step-and-scan apparatus) the mask table MT may just be connected to a short stroke actuator, or may be fixed. During imaging, the reticle and substrate may be aligned using reticle alignment marks $M_1$, $M_2$ and substrate alignment marks $P_1$, $P_2$.

The depicted apparatus can be used in two different modes:

1. In step mode, the mask table MT is kept essentially stationary, and an entire mask image is projected in one go (i.e. a single "flash") onto a target portion C. The substrate table WT is then shifted in the x and/or y directions so that a different target portion C can be irradiated by the beam PB;

2. In scan mode, essentially the same scenario applies, except that a given target portion C is not exposed in a single "flash". Instead, the mask table MT is movable in a given direction (the so-called "scan direction", e.g. the y direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

An important factor influencing the imaging quality of a lithographic apparatus is the accuracy with which the mask image is focused on the substrate. In practice, since the scope for adjusting the position of the focal plane of the projection system PL is limited and the depth of focus of that system is small, this means that the exposure area of the wafer (substrate) must be positioned precisely in the focal plane of the projection system PL. To do this, it is desirable to know both the position of the focal plane of the projection system PL and the position of the top surface of the wafer. Wafers are polished to a very high degree of flatness but nevertheless deviation of the wafer surface from perfect flatness (referred to as "unflatness") of sufficient magnitude noticeably to affect focus accuracy can occur. Unflatness may be caused, for example, by variations in wafer thickness, distortion of the shape of the wafer or contaminants on the wafer holder. The presence of structures due to previous process steps also significantly affects the wafer height (flatness). In the present invention, the cause of unflatness is largely irrelevant. Unless the context otherwise requires, references below to "the wafer surface" refer to the top surface of the wafer onto which will be projected the mask image.

In one example of operation of a level sensor, the level sensor measures the vertical (Z) position of the physical reference surface and the vertical position of the wafer surface, $Z_{LS}$, at a plurality of points, and a second sensor, for example a Z-interferometer, which simultaneously measures the vertical position of the substrate table, $Z_{IF}$ at the same points. The wafer surface height is determined as $Z_{Wafer} = Z_{LS} - Z_{IF}$. The substrate table carrying the wafer is then transferred to the exposure station and the vertical position of the physical reference surface is again determined. The height map may then be referred to in positioning the wafer at the correct vertical position during the exposure process. One example of a level sensor that could be used in accordance with the present invention is disclosed in U.S. Pat. No. 5,191,200, and U.S. patent application Ser. No. 09/519,875 filed Mar. 6, 2000 both of which are herein incorporated by reference in their entirety.

Figure 2:
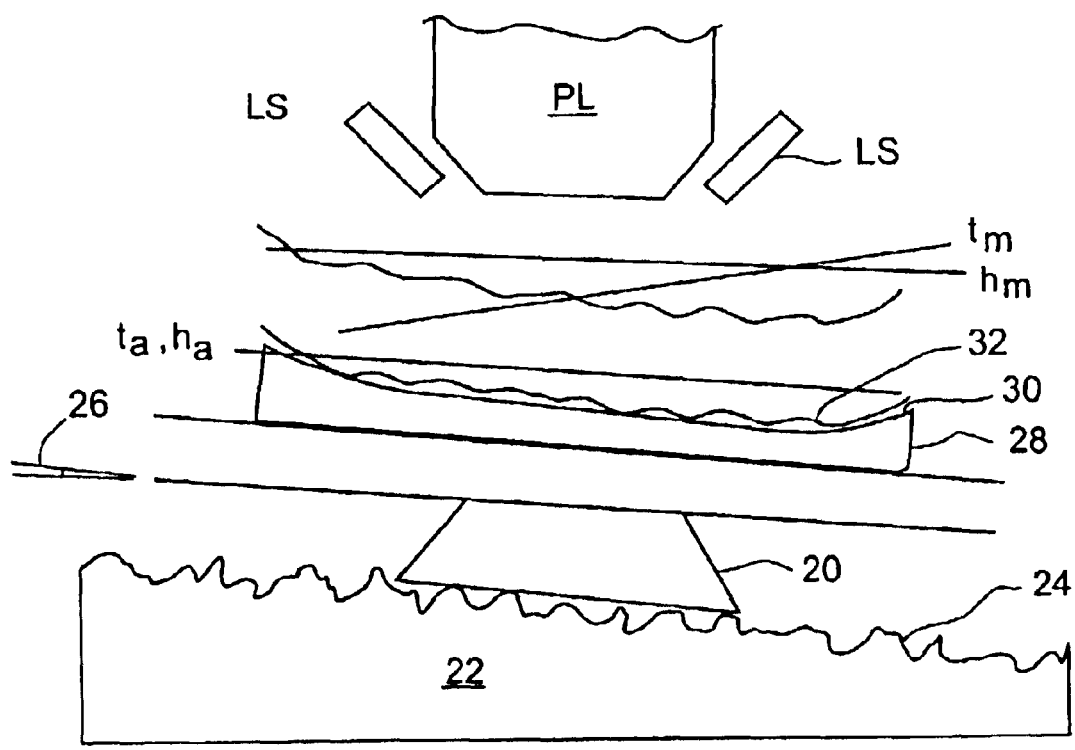
FIG. 2 is a schematic diagram showing various contributions to level sensor errors.

As shown in FIG. 2, there are many contributions to measurement errors in level sensor measurements. In an illustrative example, an airfoot 20 rests on a base 22. The base itself may have an inherent tilt. Further, base unflatness 24 (topography) can result in additional local tilt depending on how the airfoot 20 rests on the base 22. The airfoot is coupled to a chuck via a set of chuck actuators (not shown). The chuck actuators may themselves have some tilt 26, which may be further increased if some of the actuators are actuated improperly. The chuck 28 itself may not be perfectly flat both in topography 30 and in tilt. If the chuck 28 is not perfectly flat, this can translate to unflatness of the wafer 32. Moreover, the wafer 32 itself may not be flat, it may have a wedge shape or other topology. As a result of all of these contributions, the level sensor may measure the surface of the wafer to be at a height $h_m$ different from its actual height $h_a$. Furthermore, it may measure a tilt $t_m$ different from the actual tilt $t_a$. Such errors in height and tilt measurement can result in the plane of focus of the imaging radiation to be located in the wrong plane, reducing resolution of the imaging apparatus. Moreover, as may be seen from FIG. 2, if a measured tilt is opposite to the actual tilt of the substrate, any tilt correction applied to the chuck will actually aggravate the situation rather than correct it.

Figures 3A, 3B, 3C:
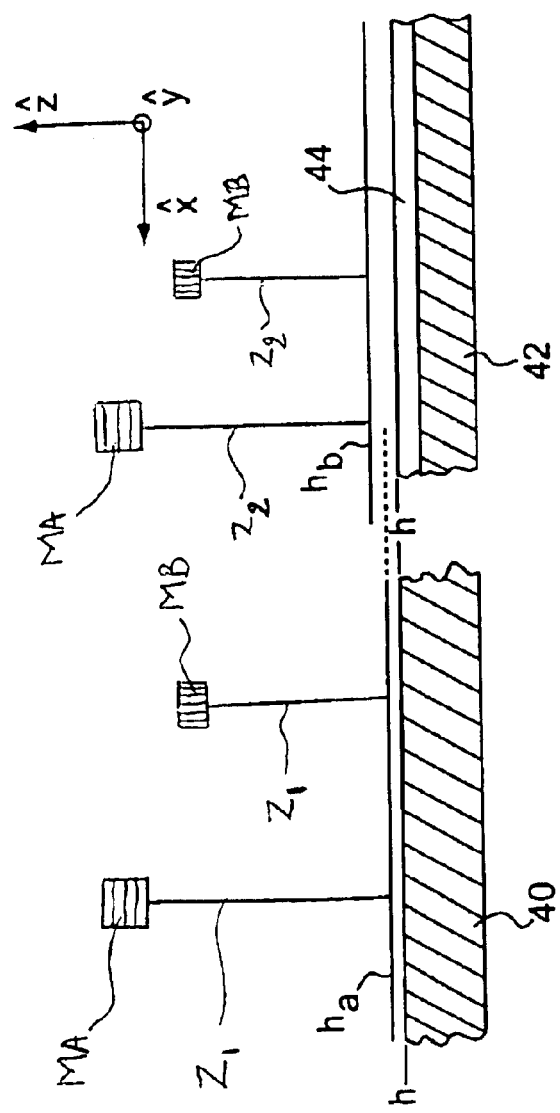
FIGS. 3a–c schematically illustrate process dependency.

FIGS. 3a–c schematically show an example of the two types of process dependency. A first, bare substrate 40 is located at a physical height h while a processed substrate 42, in this case a substrate coated with a layer of photoresist 44, is located at the same physical height h. A theoretical ideal height measuring system should determine that the surface of the bare substrate is at the exact same height as the surface of the resist of the processed substrate. However, in reality, it has been observed that the measured height $h_a$ of the bare substrate 40 will often be different from the measured height $h_b$ of the processed substrate 42 (note that $h_a$ is shown slightly different from h to represent measurement error other than process dependency). Moreover, it is possible that the measurement m of the processed substrate 42' will further show some degree of tilt as illustrated in FIG. 3c and result in an average height $h_c$, which is yet again different from the physical height h.

In FIGS. 3a–c, the coordinates are shown such that the flat substrate lies in an XY plane and the Z direction extends perpendicular to the XY plane. Using this system of coordinates, the process dependency may be characterized using three parameters, displacement in the Z direction, rotation about the Y axis and rotation about the X axis. These three parameters can be measured at a plurality of points on the substrate's surface in order to produce a set of parameters that characterize the substrate as a whole. The number of points measured can be selected to provide a desired resolution and may correspond, for example, to a number of shot areas on the substrate.

In an example of a method in accordance with an embodiment of the present invention, a particular process is characterized for a pair of machines. For each machine ($M_A$ and $M_B$) a height measurement $z_1$ for a reference substrate, and a second height measurement $z_2$ for a substrate processed in accordance with the process to be characterized is made. The measurements can be made for a series of points (x,y) on the surface of the substrates and a set of $\Delta z(x,y)$ can be calculated by simply subtracting $z_1$ from $z_2$ for each point (x,y). This set corresponds to a map of height process dependencies (including wafer thickness differences) for that machine. Similarly, a set of $R_x$ and $R_y$ measurements can be made for each machine. Though data sets are described herein, it may also be sufficient to perform a measurement at a single point x,y rather than a series of such points. Such a single point should be considered to be a set having only one member.

In one example, the reference substrate may be a bare substrate, or a substrate having a calibration coating, because it would be expected to have no process dependency at all. Alternatively, the reference substrate may be a substrate that has been processed in some predetermined way that has been characterized using another method, such as a FEM, for example. For such a processed reference substrate, once the process dependency for that substrate is known, it may be used just as another type of reference substrate would be used. In the following equations, the term "unprocessed" is used, however the equations should be understood to include any other sort of reference substrate as discussed herein.

A given level sensor has a respective spot size that may be, in certain apparatus, variable. Because level sensor data is known in certain cases to vary with spot size, one embodiment of the present invention employs level sensors having substantially the same spot size in each lithographic apparatus to be characterized. In some instances, spot size will not have a large effect and each lithographic apparatus may have a different level sensor spot size.

The data collected can then be understood in accordance with the following Equations 1–3.

$$Z_{reference} - Z_{processed} = \text{thickness}_{processed} - \text{thickness}_{reference} + HPD_{process} + \epsilon_{noise} + \epsilon_{drift} \quad [\text{Eqn. 1}]$$

$$Rx_{reference} - Rx_{processed} = \text{wedge}Rx_{processed} - \text{wedge}Rx_{reference} + TPDRx_{processed} + \epsilon_{noise} + \epsilon_{drift} \quad [\text{Eqn. 2}]$$

$$Ry_{reference} - Ry_{processed} = \text{Wedge}Ry_{processed} - \text{wedge}Ry_{reference} + TPDRy_{processed} + \epsilon_{noise} + \epsilon_{drift} \quad [\text{Eqn. 3}]$$

Equation 1 states that for a pair of substrates, one processed and one unprocessed, the measured delta Z is equal to the thickness difference, plus the height process dependency of the level sensor measurement of the processed substrate, plus two error factors, one related to detector noise and the other due to drift. Equations 2 and 3 are similar and show that the measured change in rotation around an axis equals a wedge of the processed substrate minus wedge of the unprocessed substrate plus tilt process dependency and error factors for noise and drift.

Equations 4, 5, and 6 can then be used to relate the two machines for the measured process:

$$\Delta HPD_{M1-M2} = (Z_{reference} - Z_{process})_{M1} - \quad [\text{Eqn. 4}]$$
$$(Z_{reference} - Z_{process})_{M2} + \epsilon_{processed\_M1} -$$
$$\epsilon_{processed\_M2} + \epsilon_{reference\_M2} - \epsilon_{reference\_M1} +$$
$$\epsilon_{noise\_M1} - \epsilon_{noise\_M2} + \epsilon_{drift\_M1} - \epsilon_{drift\_M2}$$

In equation 4, $\epsilon_{processed}$ and $\epsilon_{reference}$ are overall errors in measured thickness and each has a value for each machine, M1, M2.

$$\Delta TPDRx_{M1-M2} = (Rx_{reference} - Rx_{process})_{M1} - \quad [\text{Eqn. 5}]$$
$$(Rx_{reference} - Rx_{process})_{M2} +$$
$$\epsilon_{Rxprocessed\_M1} - \epsilon_{Rxprocessed\_M2} +$$
$$\epsilon_{Rxreference\_M2} - \epsilon_{Rxreference\_M1} +$$

-continued $$\varepsilon_{Rxnoise\_M1} - \varepsilon_{Rxnoise\_M2} +$$
$$\varepsilon_{Rxdrift\_M1} - \varepsilon_{Rxdrift\_M2}$$

$$\Delta TPDRy_{M1-M2} = (Ry_{reference} - Ry_{process})_{M1} - \quad [\text{Eqn. 6}]$$
$$(Ry_{reference} - Ry_{process})_{M2} +$$
$$\varepsilon_{Ryprocessed\_M1} - \varepsilon_{Ryprocessed\_M2} +$$
$$\varepsilon_{Ryreference\_M2} - \varepsilon_{Ryreference\_M1} +$$
$$\varepsilon_{Rynoise\_M1} - \varepsilon_{Rynoise\_M2} +$$
$$\varepsilon_{Rydrift\_M1} - \varepsilon_{Rydrift\_M2}$$

Likewise, after making the two sets of measurements for each of a group of machines, any two machines can be compared using equations 4, 5 and 6. Once the sets of data are collected and the equations evaluated, the results may be used to adjust a focal plane of the apparatus so that each exposure is in or near a best focus plane. Additional sets of data for each of the reference and processed substrates may be measured for additional apparatus so that more than two apparatus may be characterized in a similar fashion. In characterizing multiple apparatus, for example, a third apparatus may be compared to either one of a first and a second apparatus or a combination of the two.

In certain circumstances, height process dependency accounts for a larger problem than does either of the two tilt process dependencies. In such a case, a method in accordance with an embodiment of the present invention may be employed measuring only the height measurements for each point measured. The inventors have determined that by using light having a wavelength less than about 950 nm, level sensor process dependency may be further reduced.

Drift calibrations can be made in order to correct for machine drift. Likewise, noise error may be reduced by averaging a series of measurements. By employing both techniques, the error (ε) portions of each equation can be reduced to a very low level leaving a measurement that essentially captures the process dependencies. In practice, these corrections can provide measurements that have a higher degree of accuracy than FEMs while greatly reducing the total time necessary to make the measurements. In one example of a drift correcting method multiple measurements are made on each apparatus for each substrate and the two substrates are alternated between measurements. The resulting data points may be plotted to show a drift curve. The empirically determined curve may be used to extrapolate drift data, or, in some cases, a function may be fit to the curve and used to calculate expected drift.

It is further contemplated that multiple reference substrates may be employed in order to provide reduced error. Likewise, it is contemplated that substrates to be measured could be aligned at a plurality of different angles prior to leveling.

While specific embodiments of the invention have been described above, it will be appreciated that the invention may be practiced otherwise than as described. The description is not intended to limit the invention.

What is claimed is:

1. A method of calibrating level sensors of at least two lithographic projection apparatus to correct machine to machine level sensor process dependency, the calibrating comprising:
   measuring a first set of leveling data using a first lithographic projection apparatus for a reference substrate,
   measuring a second set of leveling data using the first apparatus for a substrate processed according to a selected process;
   measuring a third set of leveling data using a second apparatus for the reference substrate;
   measuring a fourth set of leveling data using the second apparatus for the substrate processed according to the selected process; and
   using the first, second, third and fourth sets of leveling data to calculate a set of level sensor parameters corresponding to first apparatus to second apparatus level sensor differences for the selected process.

2. A method according to claim 1 wherein the reference substrate is a bare substrate.

3. A method according to claim 1 wherein the reference substrate comprises a substrate having a calibration resist thereon.

4. A method according to claim 1 wherein the reference substrate is a substrate that has been processed according to a predetermined process, the method further comprising:
   characterizing a machine to machine process dependency of the predetermined process.

5. A method according to claim 1 further comprising:
   measuring a fifth set of leveling data using a third apparatus for the reference substrate;
   measuring a sixth set of leveling data using the third apparatus for the substrate processed according to the selected process performing additional measurements; and
   using the first and second sets of leveling data, and/or the third and fourth sets of leveling data, with the fifth and sixth sets of leveling data to calculate a set of level sensor parameters corresponding to at least one of first apparatus to third apparatus level sensor differences for the selected process and/or second apparatus to third apparatus level sensor differences for the selected process.

6. A method according to claim 1 wherein the measuring comprises taking a plurality of measurements at each of a plurality of points on the measured substrates.

7. A method according to claim 1 wherein the measuring further comprises taking a plurality of measurements at each measured point on the measured substrates and wherein the substrates are alternated between measurements.

8. A method according to claim 1 wherein the measuring further comprises the substrate being loaded on a chuck during measurements and reloading the substrate onto the chuck between measurements.

9. A method according to claim 1 wherein the measuring further comprises using a level sensor of each apparatus, each said level sensor having a respective spot size and each respective spot size being substantially the same size.

10. A device manufacturing method using a lithographic projection apparatus comprising:
    imaging a patterned beam of radiation onto a target area of a substrate having a layer of radiation sensitive material;
    prior to said imaging, providing a set of process dependent parameters for adjusting the imaging, said parameters being determined by:
       measuring a first set of leveling data using a first lithographic projection apparatus for an unprocessed substrate;
       measuring a second set of leveling data using the first apparatus for a substrate processed according to a selected process;

measuring a third set of leveling data using a second apparatus for the unprocessed substrate;

measuring a fourth set of leveling data using the second apparatus for the processed substrate; and using the first, second, third and fourth sets of leveling data to calculate a set of level sensor parameters corresponding to first apparatus to second apparatus level sensor differences for the selected process.

11. A lithographic projection apparatus comprising:

a radiation system for providing a projection beam of radiation;

a support structure for supporting patterning means, the patterning means serving to pattern the projection beam according to a desired pattern;

a substrate table for holding a substrate;

a projection system for projecting the patterned beam onto a target portion of the substrate;

an input configured to accept as an input a first set of leveling data using a first lithographic projection apparatus for a reference substrate, an input configured to accept as an input a second set of leveling data using the first apparatus for a substrate processed according to a selected process;

an input configured to accept as an input a third set of leveling data using a second apparatus for the reference substrate;

an input configured to accept as an input a fourth set of leveling data using the second apparatus for the substrate processed according to the selected process; and a processor, configured to use the first, second, third and fourth sets of leveling data to calculate a set of level sensor parameters corresponding to first apparatus to second apparatus level sensor differences for the selected process.

* * * * *